(12) United States Patent
Kim et al.

(10) Patent No.: US 7,083,899 B2
(45) Date of Patent: Aug. 1, 2006

(54) METHOD FOR MANUFACTURING A SEMICONDUCTOR DEVICE

(75) Inventors: Bong-Cheol Kim, Gyeonggi-do (KR); Dae-Youp Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 243 days.

(21) Appl. No.: 10/430,112

(22) Filed: May 5, 2003

(65) Prior Publication Data
US 2004/0058280 A1    Mar. 25, 2004

(30) Foreign Application Priority Data
Sep. 25, 2002    (KR) .......................... 10-2002-58180

(51) Int. Cl.
*G03F 7/00*    (2006.01)
(52) U.S. Cl. ..................... 430/317; 430/311; 430/312; 430/314; 430/316
(58) Field of Classification Search ................ 430/311, 430/312, 314, 316, 317
See application file for complete search history.

(56) References Cited

U.S. PATENT DOCUMENTS

| | | | | |
|---|---|---|---|---|
| 5,935,762 | A | 8/1999 | Dai et al. ................... | 430/312 |
| 6,132,928 | A * | 10/2000 | Tanabe et al. ............ | 430/270.1 |
| 6,323,121 | B1 * | 11/2001 | Liu et al. .................... | 438/633 |
| 6,337,269 | B1 * | 1/2002 | Huang et al. ............... | 438/618 |
| 6,689,695 | B1 * | 2/2004 | Lui et al. .................... | 438/700 |
| 6,774,037 | B1 * | 8/2004 | Hussein et al. ............. | 438/666 |
| 6,790,770 | B1 * | 9/2004 | Chen et al. .................. | 438/637 |
| 6,821,896 | B1 * | 11/2004 | Shih ........................... | 438/692 |
| 2002/0058397 | A1 * | 5/2002 | Smith et al. ................ | 438/475 |
| 2003/0129844 | A1 * | 7/2003 | Wang et al. ................ | 438/694 |

FOREIGN PATENT DOCUMENTS

| | | |
|---|---|---|
| KR | 2002-55889 | 7/2002 |
| KR | 2002-66567 | 8/2002 |

OTHER PUBLICATIONS

English language of Korean Publication No. 2002-66567.
English language of Korean Publication No. 2002-55889.

* cited by examiner

*Primary Examiner*—Nicole Barreca
(74) *Attorney, Agent, or Firm*—Marger Johnson & McCollom, P.C.

(57) ABSTRACT

Disclosed is a method for manufacturing a semiconductor device by employing a dual damascene process. After a first insulation film including a conductive pattern is formed on a substrate, at least one etch stop film and at least one insulation film are alternatively formed on the first insulation film. A via hole for a contact or a trench for a metal wiring is formed through the insulation film, and then the via hole or the trench is filled with a filling film including a water-soluble polymer. After a photoresist film is coated on the filling film, the photoresist film is patterned to form a photoresist pattern and to remove the filling film. The DOF and processing margin of the photolithography process for forming the photoresist pattern can be improved because the photoresist film can have greatly reduced thickness due to the filling film.

15 Claims, 13 Drawing Sheets

METHOD FOR MANUFACTURING A SEMICONDUCTOR DEVICE

CROSS REFERENCE TO RELATED APPLICATIONS

This application claims priority under 35 USC §119 to Korean patent application No. 2002-58180, filed on Sep. 25, 2002, the contents of which are hereby incorporated by reference in their entirety.

BACKGROUND OF THE INVENTION

1. Field of the Invention

The present invention relates to a method for manufacturing a semiconductor device, and more particularly to a method for manufacturing a semiconductor device using a dual damascene process in which a contact and a metal wiring are formed in a trench and a via hole, respectively.

2. Description of the Related Art

For some time now, semiconductor devices have been employed in most electronic devices including not only information processing apparatuses but also home appliances. For an information processing apparatus such as a computer, our technological society requires that the apparatus develop a larger processing capacity and a more rapid processing speed. Thus, the semiconductor device installed in the information processing apparatus is also required to have a rapid response speed and large storage capacity. This is achieved through a high integration level of the semiconductor device.

In general, the storage capacity of a random access memory (RAM) chip can be expressed by using the empirically obtained Moores' law that indicates a general development rate of a memory chip. According to Moores' law, the storage capacity of a memory chip increases by a factor of four every three years. This increase is accomplished through a combination of reducing the size of the semiconductor device and increasing the length of a silicon chip in accordance with the size reduction of the semiconductor device. As the size of the semiconductor device installed on the silicon chip is reduced, interconnect lines of the semiconductor device are also diminished. When the interconnect lines are closely arranged, however, the interconnect lines interfere with each other. In cases where the interval between the interconnect lines is below a predetermined value, the signal delay in the device is caused entirely by the interference between the interconnect lines. To subsequently increase the processing speed of the semiconductor device in this situation, the specific resistance in the metal used for forming the interconnect lines must be reduced.

Until recently, the interconnect lines of the semiconductor device were formed using aluminum (Al) or aluminum alloy having the specific resistance of approximately 2.66 μΩ·cm. However, since International Business Machine Co. disclosed a method for forming an interconnect line with copper (Cu) in 1998, various researchers have progressed and improved the methods for forming interconnect lines or wiring using copper. Conventional photolithography processes are rarely used for forming interconnect lines or wiring with copper because the copper is too rapidly diffused in most metal films. Thus, a damascene process was developed in order to form the copper interconnection line or the copper wiring. In fact, a dual damascene process is often advantageously employed because the metal wiring and a contact can be simultaneously formed in one process.

U.S. Pat. No. 5,935,762 (issued to Chang-Ming Dai), Korean Laid Open Patent Publication No. 2002-66567, and Korean Laid Open Patent Publication No. 2002-55889 disclose methods for manufacturing a semiconductor device with copper interconnection lines using a dual damascene process.

FIGS. 1A to 1E are cross-sectional views illustrating a conventional method for manufacturing a semiconductor device.

Referring to FIG. 1A, a first insulation film 15 including a groove or a trench is formed on a semiconductor substrate 10. A conductive pattern 20 is formed in the groove or the trench, and the upper face of the conductive pattern 20 is exposed.

After a barrier layer 25 is formed on the first insulation film 15 and the conductive pattern 20, a second insulation film 30 and a third insulation film 35 are successively formed on the barrier film 25. The third insulation film 35 includes material having a dielectric constant below approximately 3.5.

A via hole is formed through the second insulation film 30 in order to form a contact electrically connecting the conductive pattern 20 to a metal wiring that is successively formed. The second insulation film 30 electrically isolates adjacent contacts formed in adjacent via holes from each other. Meanwhile, a trench is formed through the third insulation film 35, and the metal wiring is formed in the trench. The third insulation film 35 electrically isolates adjacent metal wirings formed in adjacent trenches from each other. To accomplish this purpose, the third insulation film 35 includes a low dielectric material having carbon (C) or oxygen (O2) so as to prevent the increase in the capacitance between the adjacent metal wirings.

Referring to FIG. 1B, after a first photoresist film (not shown) is coated on the third insulation film 35, the first photoresist film is patterned to form a first photoresist pattern 40 for the formation of the via hole 45 through the second insulation film 30.

Subsequently, portions of the third and second insulation films 35 and 30 are etched using the first photoresist pattern 40 as an etching mask until a portion of the barrier layer 25 positioned on the conductive pattern 20 is exposed. Thus, the via hole 45 is formed through the second insulation film 30. Next, the first photoresist pattern 40 is removed.

Referring to FIG. 1C, a second photoresist film 50 is coated on the third insulation film 35 to fill up the via hole 45 by a spin coating process. The overall thickness Tpr of the second photoresist film 50 becomes very thick because the second photoresist film 50 fills up the via hole 45 formed through the second and the third insulation films 30 and 35.

Referring to FIG. 1D, the second photoresist film 50 is patterned to form a second photoresist pattern 55 for forming the trench by a photolithography process.

Subsequently, the third insulation film 35 is partially etched using the second photoresist pattern 55 as an etching mask so that the trench 60 having a line shape that is partially connected to the via hole 45 is formed through the third insulation film 35. The trench 60 is where the metal wiring will be located, and it has a size wider than that of the via hole 45. Next, the barrier layer 15 is partially etched, thereby exposing the conductive pattern 20 in the first insulation film 15.

Referring to FIG. 1E, after the second photoresist pattern 55 is removed, the via hole 45 and the trench 60 is filled by a copper (Cu) film formed by a sputtering process, a chemical vapor deposition process, or an electro plating process. Then, the copper film is polished through a chemical-mechanical polishing (CMP) process. Thus, metal wiring 70 and a contact 65 electrically connected to the conductive pattern 20 are formed in the trench 60 and via hole 45 (FIG. 1D), respectively.

However, in the conventional semiconductor manufacturing method using the dual damascene process, because the height of the photoresist film coated on the insulation film is exceedingly high in order to form the trench in which the metal wiring is positioned, the deep of focus (DOF) of the photolithography process may not be sufficiently ensured when the photoresist film is patterned with the photolithography process. As a result, the photoresist pattern formed from the photoresist film may not have a desired shape and dimension. That is, to form the photoresist pattern serving as an etching mask during the formation of the via hole or the trench, a photoresist film 50 having exceedingly thick thickness Tpr is coated on the insulation film 35 as shown in FIG. 1C. Hence, when the photoresist film 50 is exposed and developed to form the photoresist pattern, the margin for the DOF of the photolithography process may be reduced too much so that the DOF of the photolithography process is greatly deteriorated. The via hole or the trench may not have precise dimensions since the photoresist pattern formed under such processing condition may not have a required dimension and a precise shape. As a result, the manufacturing process yield of the semiconductor device may be reduced. When the thickness Tpr of the photoresist film is reduced, the etching durability of the photoresist pattern may be deteriorated although the DOF of the photolithography process may be improved.

SUMMARY OF THE INVENTION

The present invention has been made to solve the aforementioned problems and accordingly, it is a first object of the present invention to provide a method for manufacturing a semiconductor device by employing a dual damascene process. The dual damascene process reduces the thickness of a photoresist film for forming a via hole or a trench due to a filling film so that the deep of focus (DOF) of the photolithography process for the photoresist film can be improved. Thus, the processing margin of the photolithography process can be ensured.

It is a second object of the present invention to provide a method for manufacturing a semiconductor device by employing a dual damascene process. The dual damascene process enhances the manufacturing yield of the semiconductor device by forming a via hole and a trench having precisely controlled dimensions due to an accurately controlled photoresist pattern in accordance with a filling film.

In order to achieve these objects according to a preferred embodiment of the invention, after a first insulation film including a conductive pattern is formed on a semiconductor substrate, a first etch stop film, a second insulation film, a second etch stop film, a third insulation film, and a capping film are successively formed on the first insulation film. Then, a first photoresist pattern is formed on the capping film by patterning a first photoresist film formed on the capping film, and a via hole exposing the conductive pattern is formed by partially etching the capping film, the third insulation film, the second etch stop film, the second insulation film, and the first etch stop film using the first photoresist pattern as an etching mask. Subsequently, a filling film that fills the via hole is formed on the third insulation film, and a second photoresist film is formed on the filling film. After the second photoresist film is patterned, a second photoresist pattern is formed while the filling film is removed. Continuously, a trench partially overlapping with the via hole is formed by etching the capping film, the third insulation film, and the second etch stop film using the second photoresist pattern as an etching mask, thereby forming a metal wiring in the trench, and a contact connected to the conductive pattern in the via hole. The filling film is removed during the developing and rinsing the second photoresist film.

To achieve these objects of the present invention according to another preferred embodiment, a first insulation film including a conductive pattern is formed on a semiconductor substrate, and then a first etch stop film, a second insulation film, a second etch stop film, a third insulation film, and a capping film are successively formed on the first insulation film. Continuously, a first photoresist pattern is formed on the capping film by patterning a first photoresist film formed on the capping film, and a trench is formed by partially etching the capping film, the third insulation film, and the second etch stop film using the first photoresist pattern as an etching mask. After a filling film that fills the trench is formed on the third insulation film, a second photoresist film is coated on the filling film. Subsequently, the second photoresist film is patterned to form a second photoresist pattern, and to remove the filling film. Then, a via hole partially overlapping the trench and exposing the conductive pattern is formed by etching the capping film, the second insulation film, and the first etch stop film using the second photoresist pattern as an etching mask. Finally, metal wiring is formed in the trench, and a contact connected to the conductive pattern is formed in the via hole.

According to embodiments of the invention, the DOF of the photolithography process is improved, and the processing margin of the photolithography process is effectively ensured because the photoresist film can have a greatly reduced thickness in comparison with the conventional photoresist film employed for the dual damascene process. Also, the manufacturing process yield for the semiconductor device is enhanced since the dimensions of the via hole and the trench are precisely controlled in accordance with the accurately controlled photoresist pattern.

BRIEF DESCRIPTION OF THE DRAWINGS

The above and other objects and advantages of the invention will become readily apparent by reference to the following detailed description when considered in conjunction with the accompanying drawings.

DETAILED DESCRIPTION OF THE INVENTION

Figure 1A:
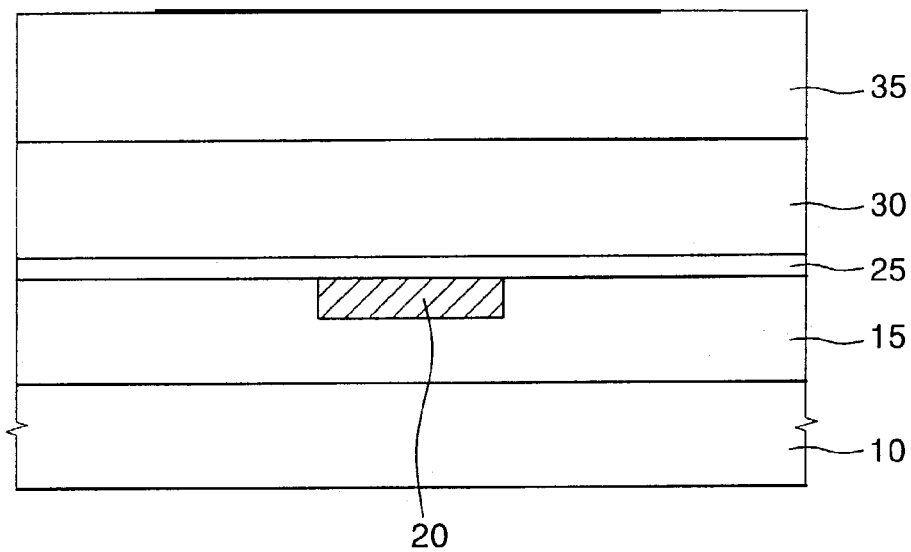
FIGS. 1A to 1E are cross-sectional views illustrating a conventional method for manufacturing a semiconductor device.
Figure 1B:
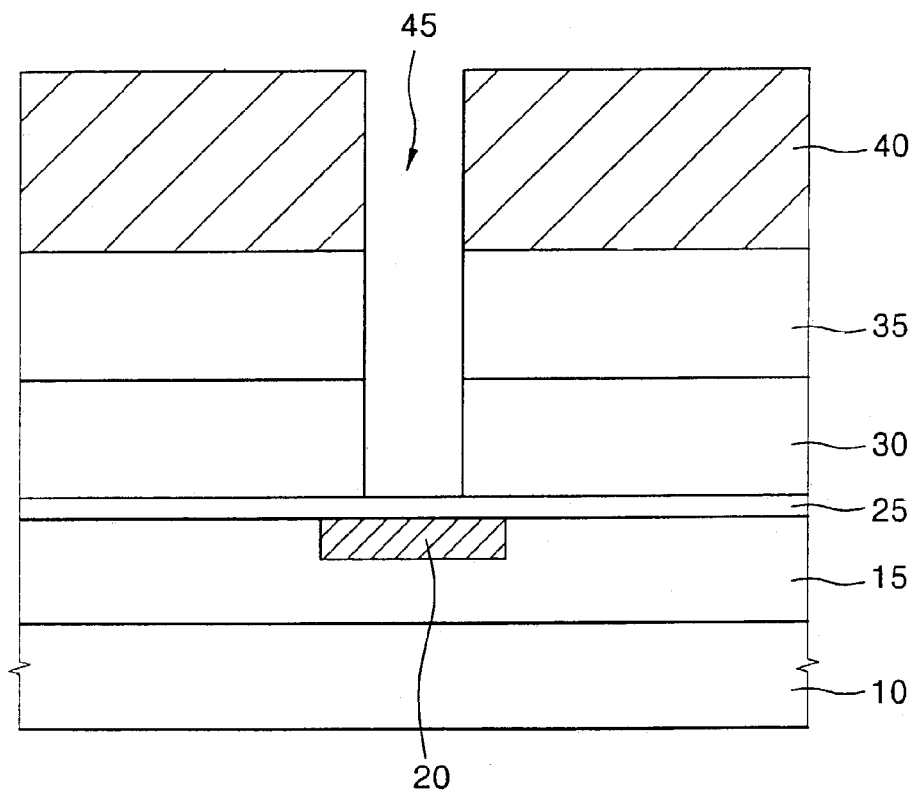

Hereinafter, some preferred embodiments of the invention will be described in detail with reference to the accompanying drawings. In the following drawings, like reference numerals identify similar or identical elements.

FIGS. 2A to 2I are cross-sectional views illustrating a method for manufacturing a semiconductor device using a dual damascene process according to a preferred embodiment of the invention.

Generally, the dual damascene structure in a semiconductor device includes a via hole to form a contact that makes electrical contact with an underlying conductive material, and a trench for forming a metal wiring therein. The dual damascene structure is usually formed through three kinds of methods as follows.

In a first method for forming the dual damascene structure, a via hole is formed before the trench is formed. The via hole is formed after the trench is formed in a second method for forming the dual damascene structure. In a third method, the via hole and the trench are simultaneously formed. These methods for forming a dual damascene structure are categorized in accordance with the order of the processes for forming the via hole and the trench by utilizing photolithography processes. Thus, a pertinent method among these methods is selected according to the sizes of the via hole and the trench, and the permitted degree of misalignment between the via hole and the trench.

In the present embodiment, the via hole is formed first, then, the trench is formed in order to accomplish the dual damascene structure in a semiconductor device.

Figure 2A:
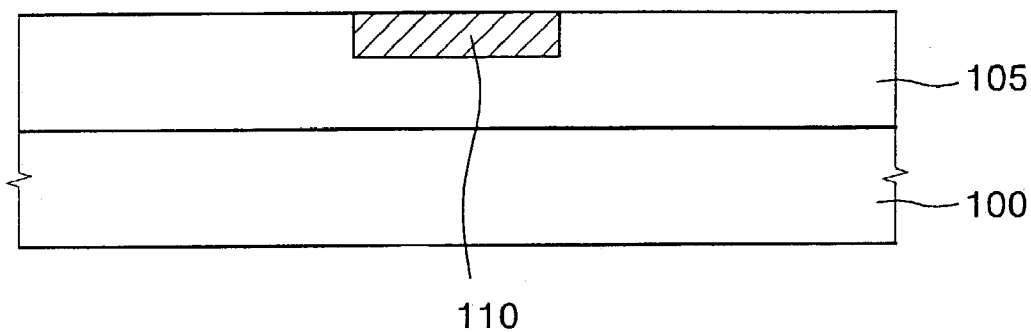
FIGS. 2A to 2I are cross-sectional views illustrating a method for manufacturing a semiconductor device by using a dual damascene process according to a preferred embodiment of the invention.

Referring to FIG. 2A, after a first insulation film 105 is formed on a semiconductor substrate 100, a groove or a trench is formed in the first insulation film 105 by etching a portion of the first insulation film 105.

Then, after conductive material is deposited on the first insulation film 105 to fill up the trench or the groove, the conductive material is polished through an etch back process or a chemical-mechanical polishing (CMP) process, thereby forming a conductive pattern 110 that fills up the trench formed in the first insulation film 105. At that time, the upper face of the conductive pattern 110 is exposed.

Figure 2B:
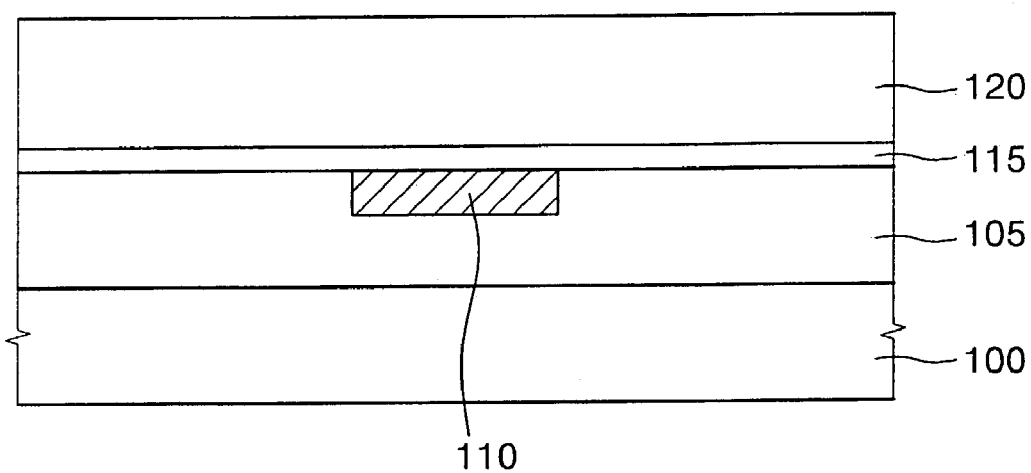

Referring to FIG. 2B, after a first etch stop film 115 is formed on the first insulation film 105 and on the conductive pattern 110, a second insulation film 120 is formed on the first etch stop film 115. The first etch stop film 115 includes non-oxide material comprising carbon (C) or a carbon compound, for example, silicon carbide (SiC). The upper surface of the first etch stop film 115 defines an etching end point for a successive etching process for forming a via hole and a trench. The first etch stop film 115 also protects the underlying conductive pattern 105 during the etching process. In this case, the first etch stop film 115 has a large etching selectivity relative to the second insulation film 120. Hence, the first etch stop film 115 is etched very slowly relative to the second insulation film 120 during a subsequent etching process.

A via hole is eventually formed through the second insulation film 120, and a contact formed in the via hole that makes electrical contact with the conductive pattern 110. The second insulation film 120 electrically isolates adjacent contacts formed in adjacent via holes from each other.

Figure 2C:
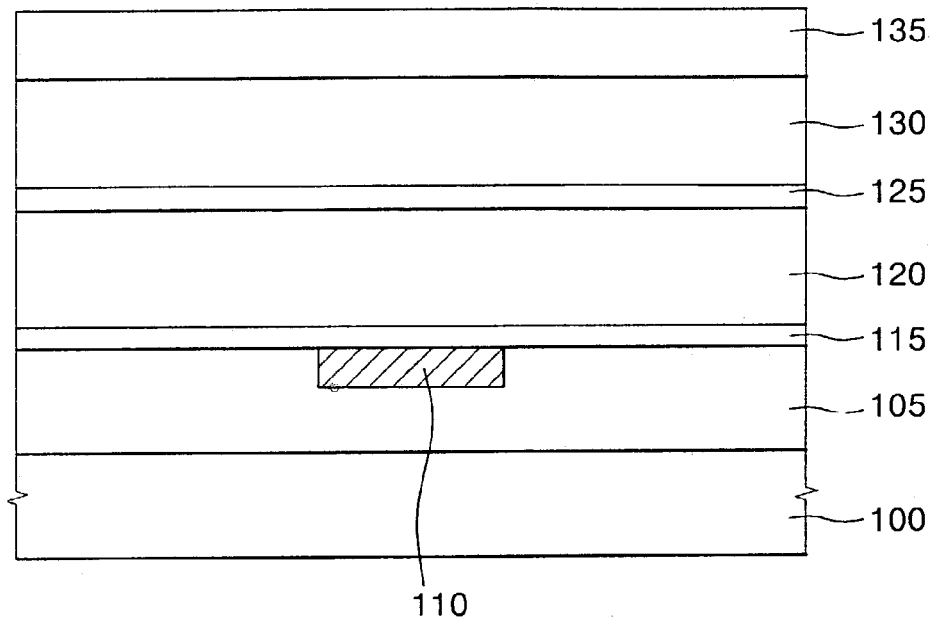

Referring to FIG. 2C, a second etch stop film 125 and a third insulation film 130 are successively formed on the second insulation film 120. The second etch stop film 125 includes silicon nitride (SiN) or a non-oxide material comprising carbon or carbon compound, such as silicon carbide. The third insulation film 130 includes an oxide that has a material having a low dielectric constant.

A trench is eventually formed through the third insulation film 130, and a metal wiring is formed in the trench. The trench is connected to the via hole formed through the second insulation film 120. The third insulation film 130 electrically isolates adjacent metal wirings formed in adjacent trenches. In this case, a parasitic capacitor comprising one metal wiring, the third insulation film 130 and another metal wiring may be formed because the distance between the adjacent metal wirings is minute. The parasitic capacitor reduces the response speed of a semiconductor device so the capacitance of the capacitor should be minimized in order to improve the response speed and the reliability of the semiconductor device. When the third insulation film 130 includes an oxide-based insulation material having a dielectric constant below approximately 3.5, the third insulation film 130 has a low permittivity such that the capacitance of the parasite capacitor is minimized. The third insulation film 130 can include a carbon-doped oxide such as silicon oxy-carbide (SiOC), hydrogen silsesquioxane including silicon-hydroxide bond (Si—OH), or methyl silsesquioxane including silicon-methoxide bond (Si—OCH3).

The upper surface of the second etch stop film 125 indicates an etching end point for precisely etching the third insulation film 130 to form the trench through the third insulation film 130. Alternately, the second etch stop film 125 may be omitted considering the simplicity of the process for manufacturing the semiconductor device.

Figure 2D:
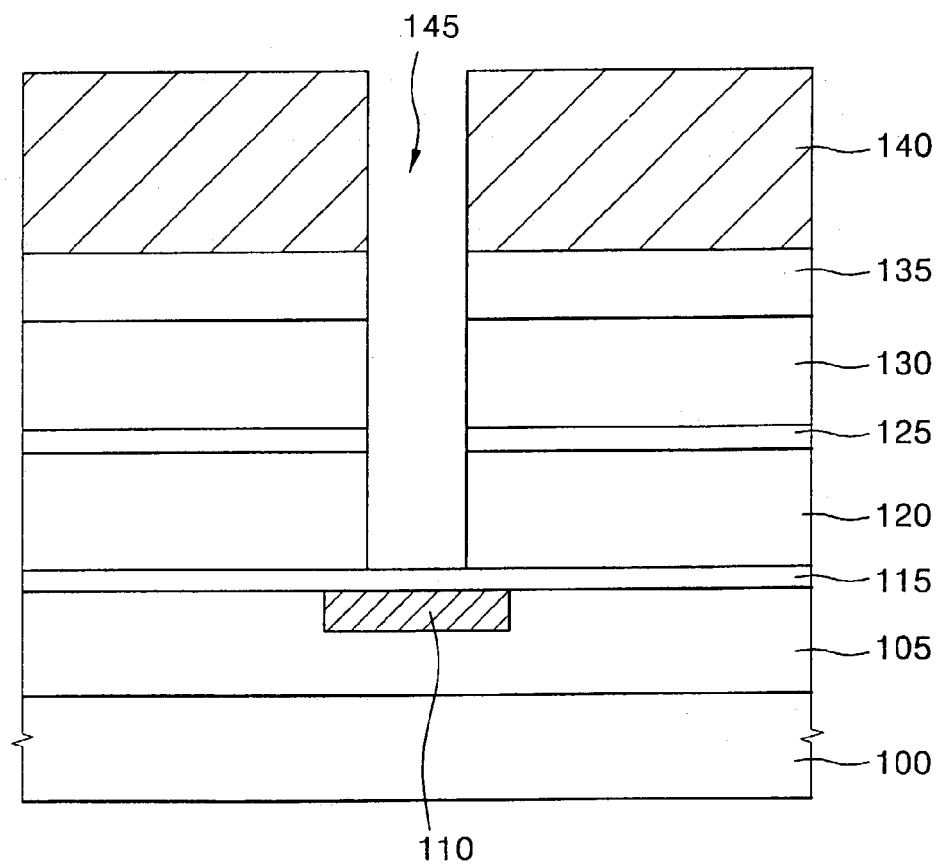

Referring to FIG. 2D, a capping film 135 is formed on the third insulation film 130 by using non-carbon based oxide such as silicon oxide (SiO2), polyethylene oxide (PEOX), undoped silicate glass (USG), or tetraethylortho silicate (TEOS). Because the capping film 135 includes an oxide which does not have carbon or carbon compound while the first etch stop film 115 includes non-oxide based insulation material having carbon or carbon compound, the capping film 135 has greater etching selectivity relative to the first etch stop film 115 in accordance with an etching solution or a etching gas. In other words, when the etching gas, which has minimal effect on carbon or carbon compound, is used, the capping film 135 is easily etched while the first etch stop film 115 is etched hardly at all.

Subsequently, a first photoresist film (not shown) is coated on the capping film 135, and the first photoresist film is exposed and developed so that a first photoresist pattern 140 is formed on the capping film 135.

Next, a portion of the capping film 135, the third insulation film 130, the second etch stop film 125, and the second insulation film 120 are etched using the first photoresist pattern 140 as an etching mask until a portion of the first etch stop film 115 is exposed. The conductive pattern 110 is positioned beneath the exposed portion of the first etch stop film 115. Thus, the via hole 145 is formed through the second insulation film 120.

Figure 2E:
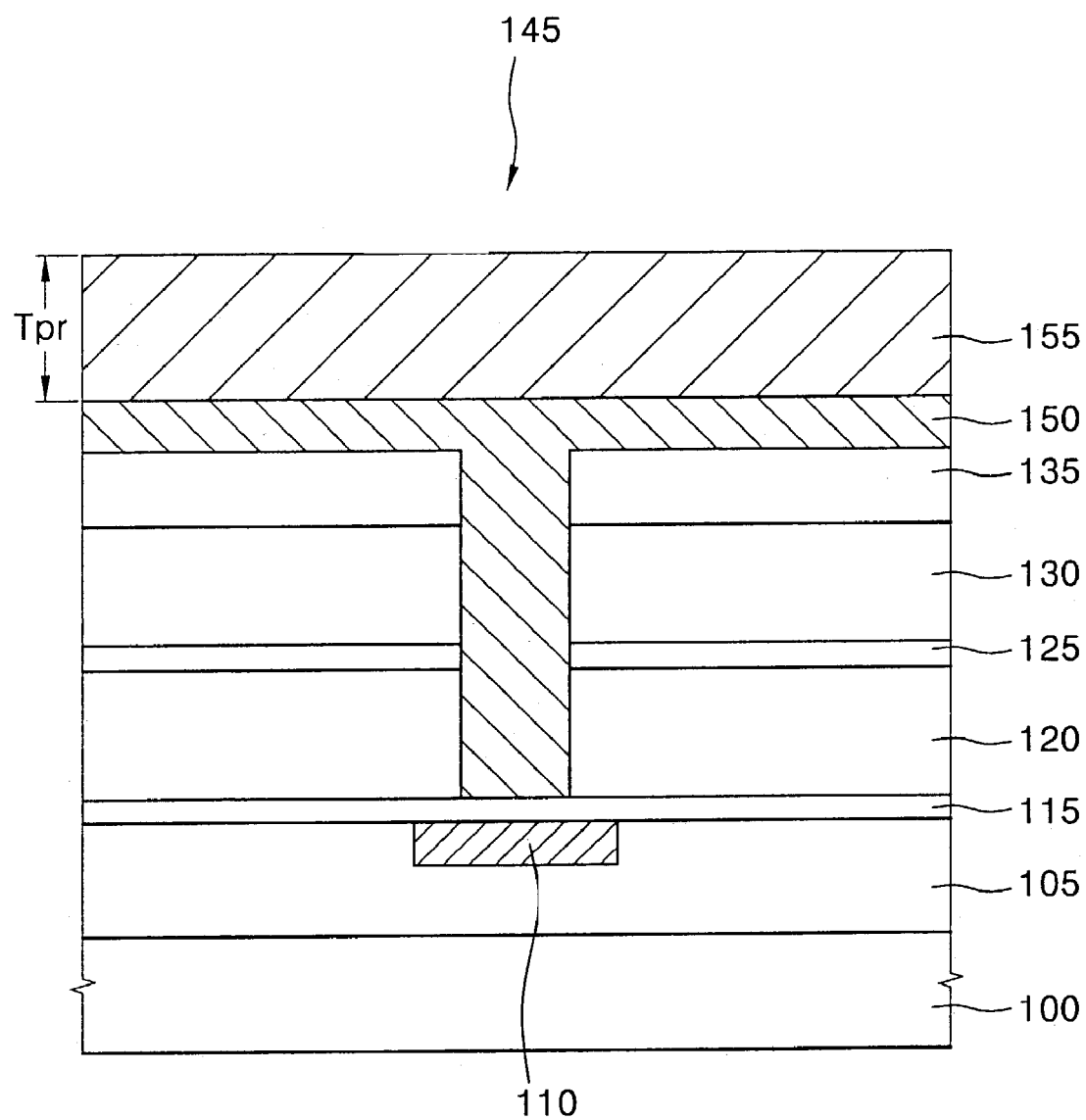

Referring to FIG. 2E, after the first photoresist pattern 140 is removed by an ashing and a stripping processes, a filling film 150 is formed on the capping film 135 to fill up the via hole 145.

The filling film 150 includes water-soluble polymer so that most of the filling film 150 can be removed when a second photoresist pattern 160 (shown in FIG. 2F) is formed through developing a second photoresist film 155. In preferred embodiments of the invention, the water-soluble polymer composing filling film 150 may include polyvinylalcohol, carboxymethylcellulose, polyacrylic acid, polyacrylamide, polyvinylpyrrolidone, polyethyleneoxide, or water-soluble polyurethane. Alternatively, the filling film 150 may include a mixture having at least two water-soluble polymers selected from among the group consisting of the above-mentioned polymers. The second photoresist film 155 has a greatly reduced thickness Tpr because the second photoresist film 155 is formed on the filling film 150 which fills the via hole 145. Thus, the depth of focus (DOF) of the photolithography process is improved when the second photoresist film 155 is patterned in order to form the second photoresist pattern 160 (FIG. 2F) without a corresponding deterioration of the etching durability of the second photoresist pattern 160.

Figure 1C:
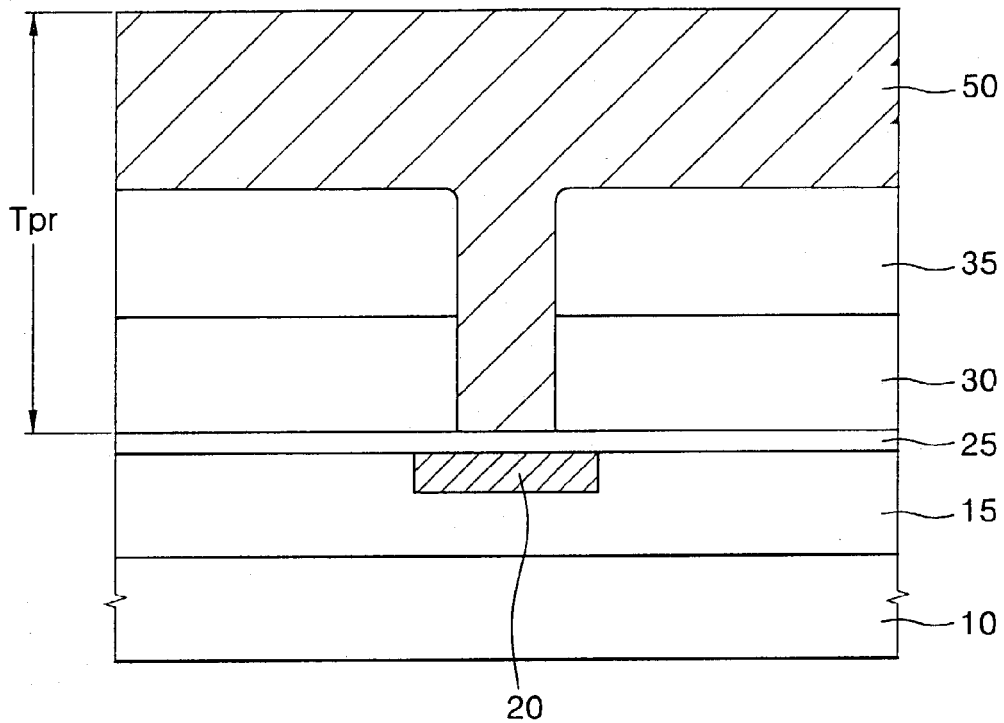
Figure 1D:
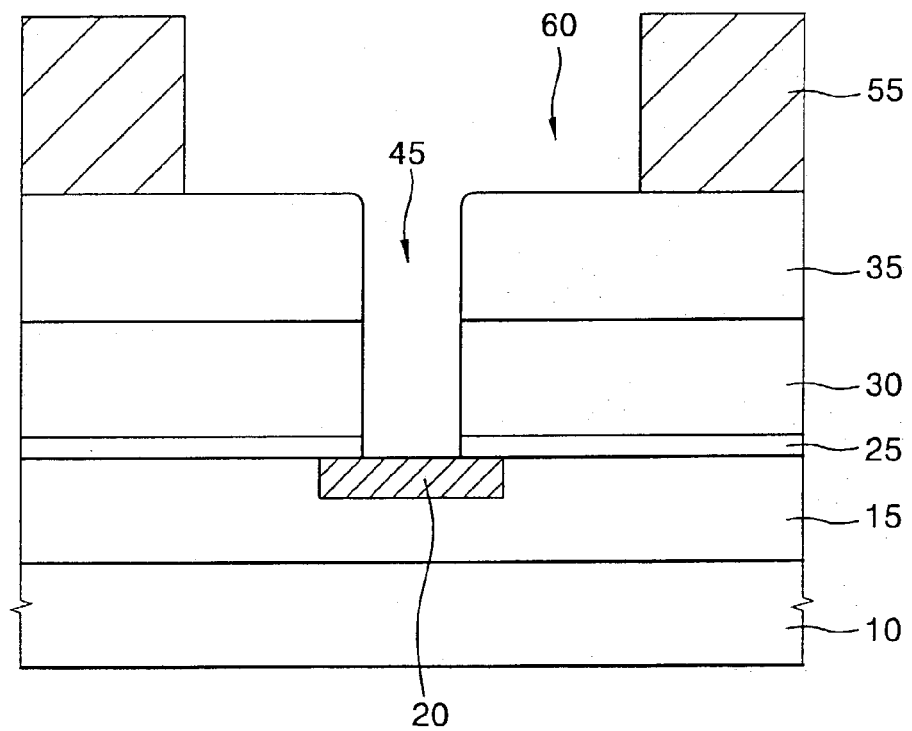
Figure 1E:
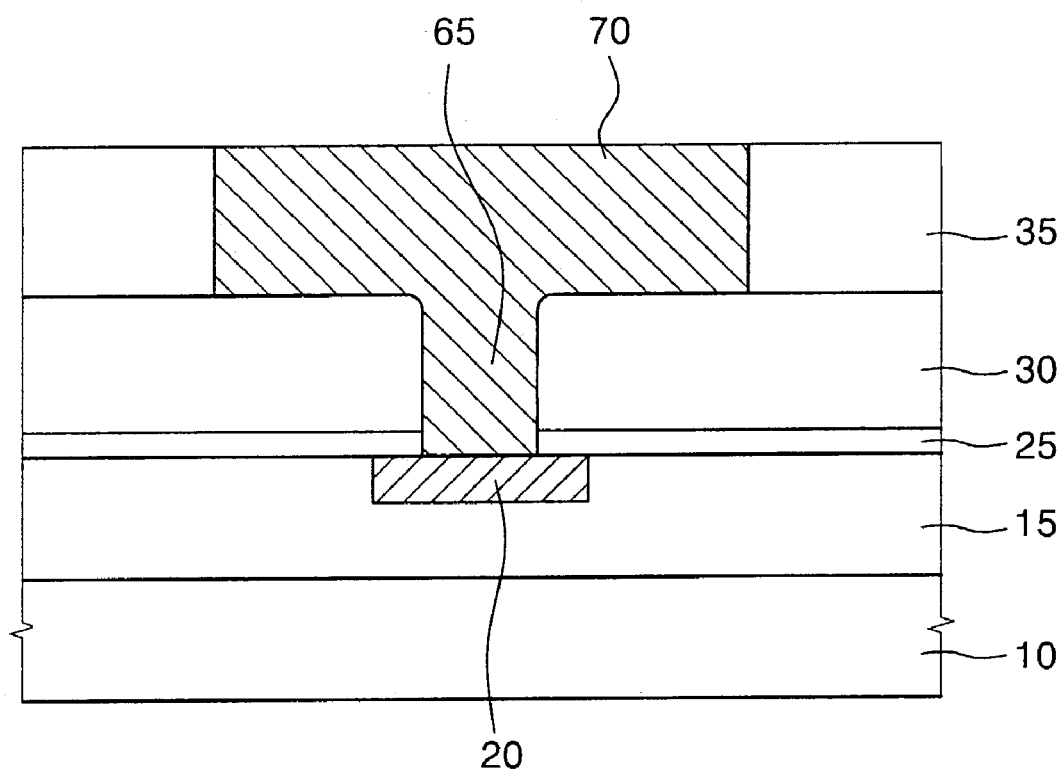

Returning to FIG. 2E, the second photoresist film 155 is coated on the filling film 150 by a spin coating process. The second photoresist film 155 has a greatly shortened thickness Tpr in comparison with the conventional photoresist pattern (element 50, FIG. 1C) since the via hole 145 is not filled with the second photoresist film 155 but rather with the filling film 150 formed on the capping film 135.

Figure 2F:
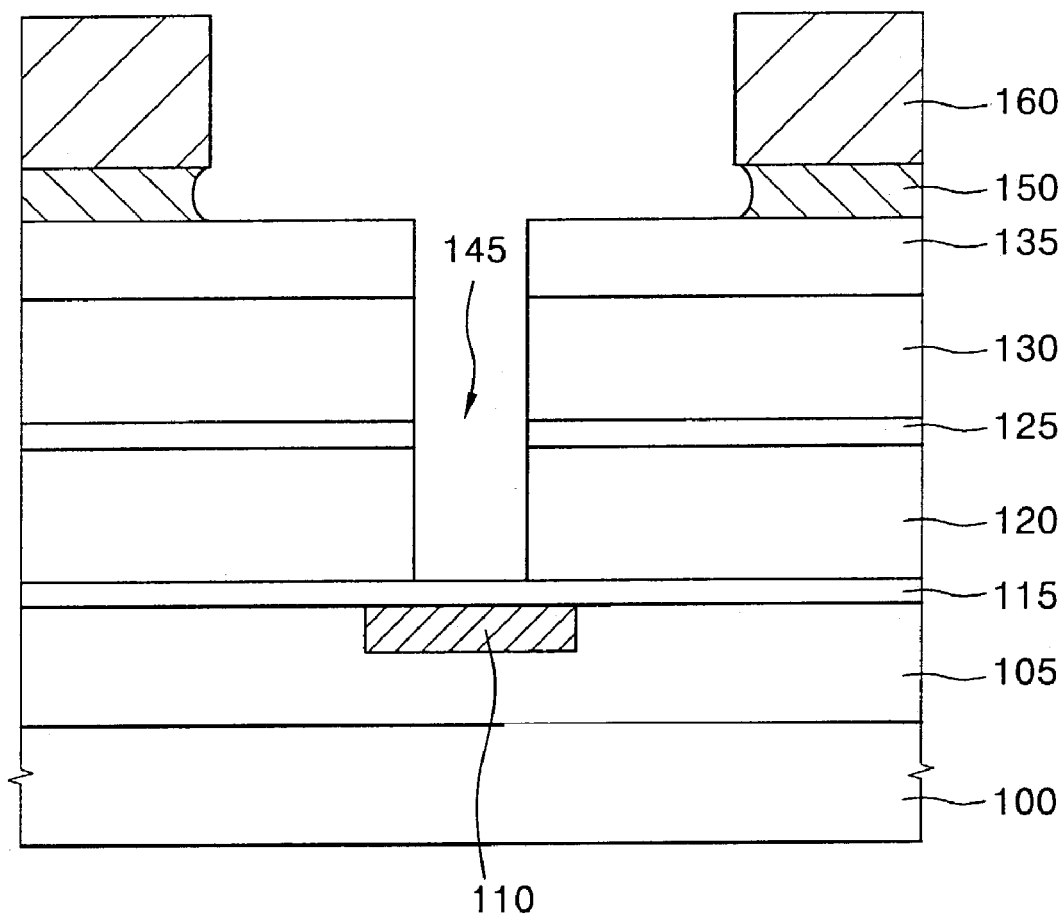

Referring to FIG. 2F, the second photoresist film 155 (FIG. 2E) is exposed, developed and rinsed leaving the second photoresist pattern 160 is formed on the filling film 150.

During the developing and rinse of the second photoresist film 155, the majority portion of the filling film 150 is removed since a developer and a rising solution used in the developing and the rinsing processes includes water such as de-ionized water and SC-1 (where the ratio of NH4OH: H2O2: H2O is about 1:1:5) or SC-2 (where the ratio of HCl: H2O2: H2O is about 1:1:5), and the minority portion of the filling film 150 remains between the second photoresist pattern 160 and the capping film 135 because the filling film 150 filling the via hole 145 includes the water-soluble polymer. Therefore, the DOF of the photolithography process for forming the second photoresist pattern 160 is enhanced without a reduction in the etching durability of the second photoresist pattern 160.

Figure 2G:
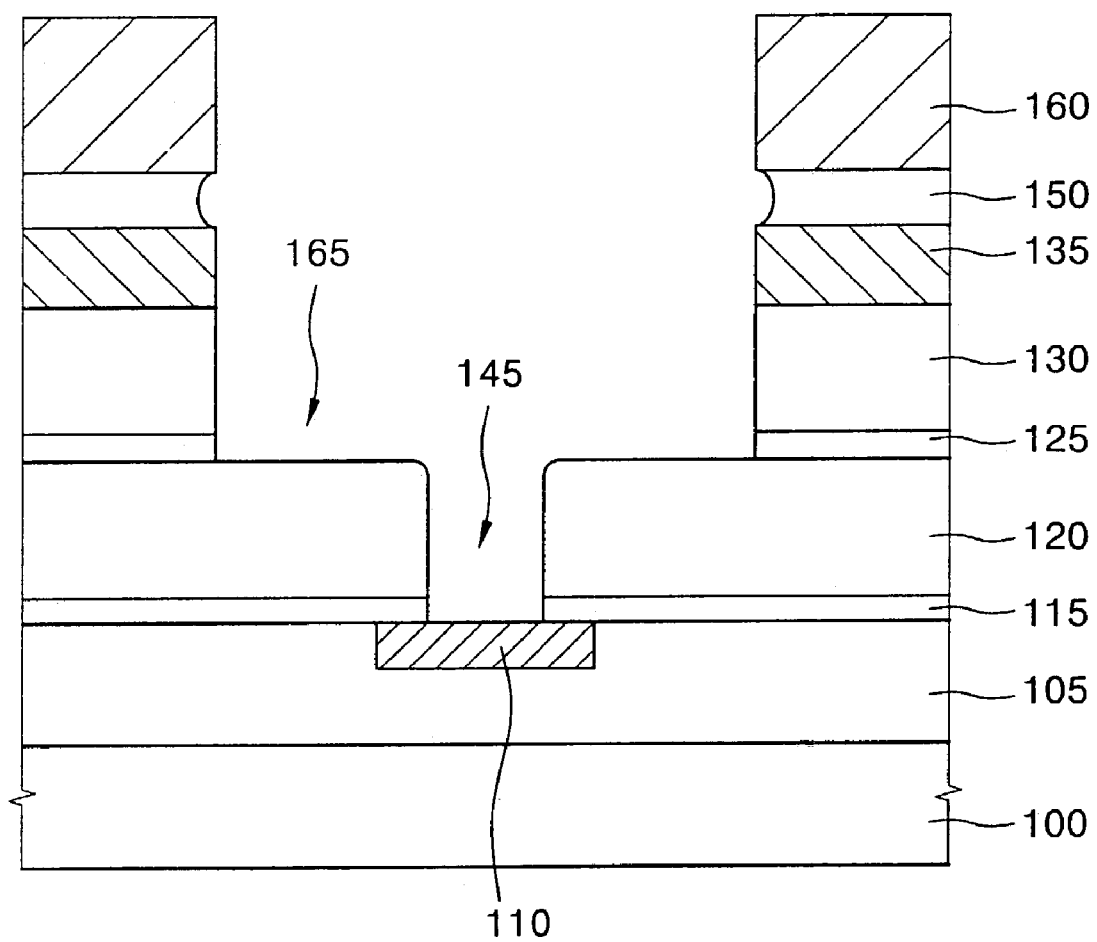

Referring to FIG. 2G, the portions of the capping film 135, the third insulation film 130, and the second etch stop film 125 are etched using the second photoresist pattern 160 as an etching mask. As a result, a trench 165 that is connected to the via hole 145 is formed through the third insulation film 130. Also at this time, the first etch stop film 115 is etched such that the conductive pattern 110 formed on the first insulation film 105 is exposed. Alternately, the first etch stop film 115 may be etched in a separate etching process to expose the conductive pattern 110.

Figure 2H:
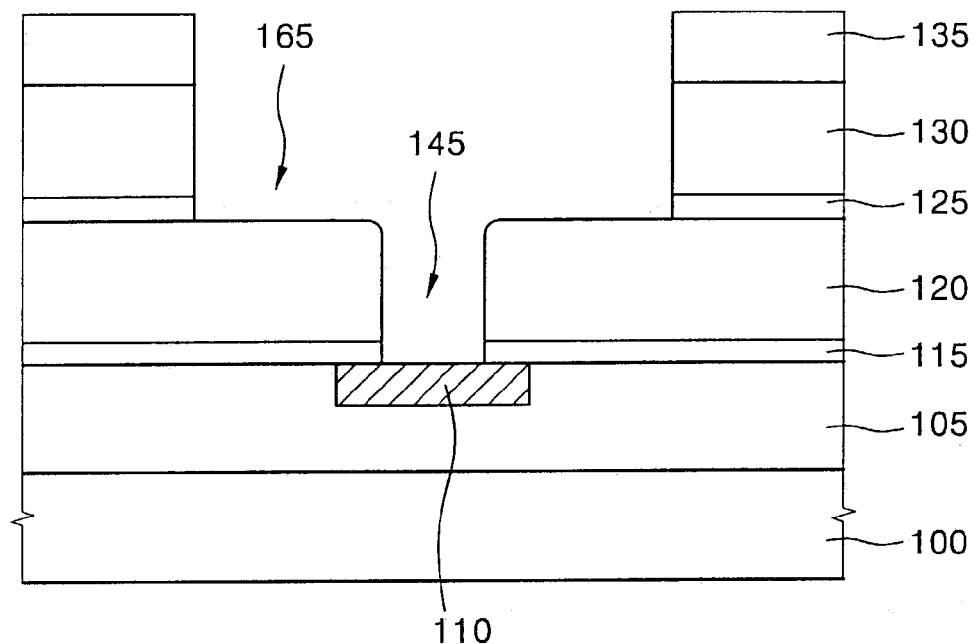

Referring to FIG. 2H, the second photoresist pattern 160 (from FIG. 2G) is removed by an ashing process or a stripping process. In this case, the remaining filling film 150 (from FIG. 2G) is completely removed from the capping film 135 during the removal of the second photoresist pattern 160 since the filling film 150 includes a polymer that is easily removed by an ashing process or a stripping process using a solution including water such as de-ionized water and SC-1 or SC-2.

The trench 165 formed through the third insulation film 130 has a line shape that overlaps the via hole 145 formed through the second insulation film 120. The metal wiring is formed in the trench 165. Thus, a dual damascene structure including the via hole 145 for forming the contact and the trench 165 for forming the metal wiring is achieved.

Figure 2I:
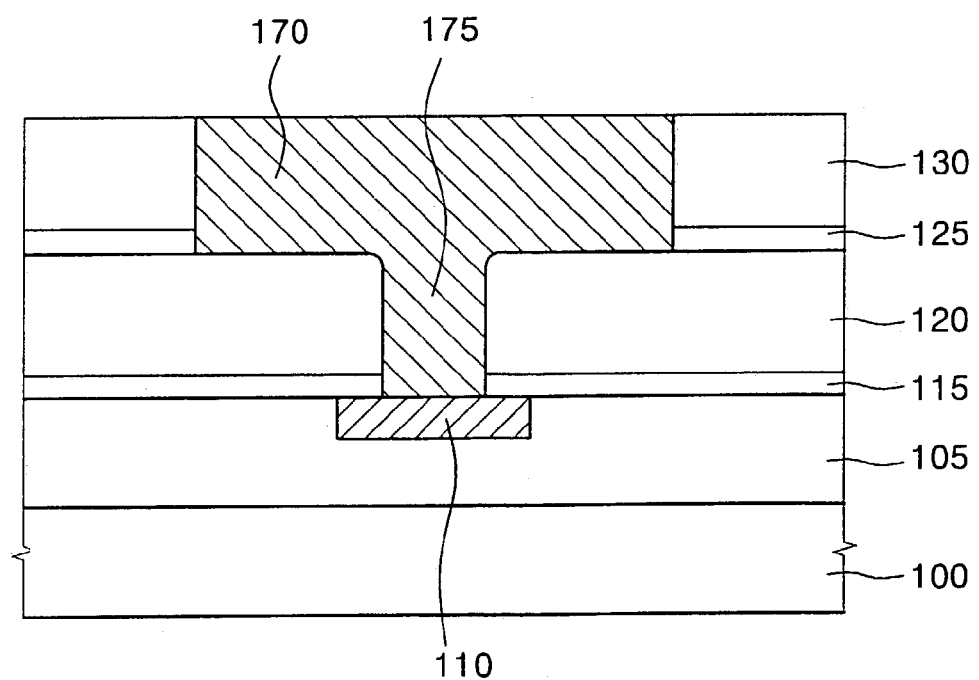

Referring to FIG. 2I, a metal film is formed on the capping film 135 (FIG. 2H) to fill up the via hole 145 and the trench 165 by depositing a metal such as copper (Cu) through a sputtering process, a chemical vapor deposition process, or an electro plating process. Then, the metal film is polished by a CMP process so that the metal wiring 170 and the contact 174 that is electrically connected to the conductive pattern 110 are formed in the trench 160 and the via hole 145 in FIG. 2H, respectively. The capping film 135 is completely removed when the upper faces of the third insulation film 130 and the metal wiring 170 are exposed during the CMP process. When the capping film 135 is completely removed, adjacent metal wirings 170 are electrically isolated from each other by the third insulation film 130 that includes a material having low dielectric constant, thereby reducing the parasitic capacitance between the adjacent metal wirings 170.

Alternately, the metal wiring 170 may be formed by polishing the metal film while the capping film 135 still partially remains on the third insulation film 130. Thus, damage to the third insulation film 130 and the metal wiring 170 is prevented because the metal film and the third insulation film 130 are not overpolished. However, the capping film 135 is preferably removed while the third insulation film 130 and the metal wiring 170 are being polished during the CMP process.

FIGS. 3A to 3D are cross-sectional views illustrating a method for manufacturing a semiconductor device by employing a dual damascene process according to another preferred embodiment of the invention.

In this embodiment, a trench for a metal wiring is formed before the formation of a via hole for a contact in order to complete a dual damascene structure. The processes for forming several films on a semiconductor substrate are identical to those of the above-described embodiment. Thus, the alternate processes for forming the trench and the via hole are highlighted in the discussion that follows.

Figure 3A:
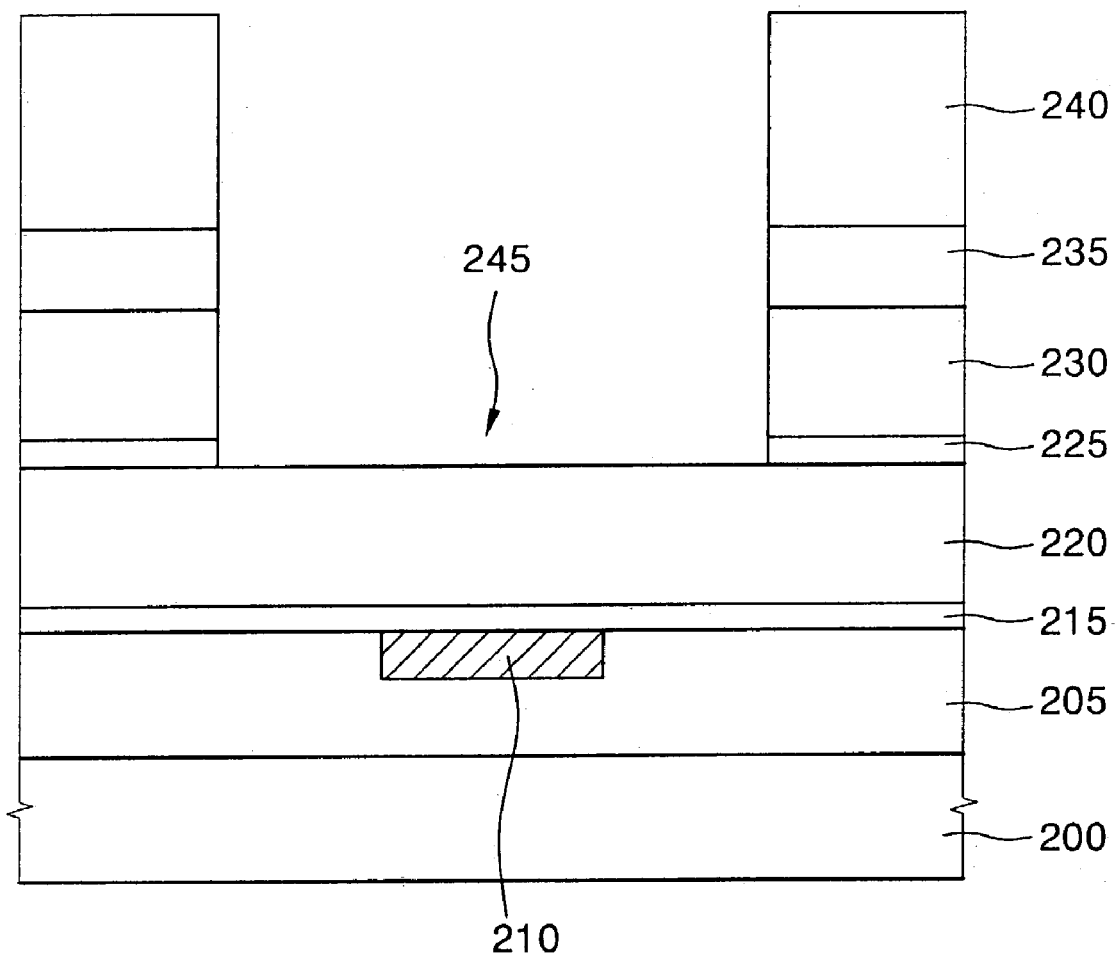
FIGS. 3A to 3D are cross-sectional views illustrating a method for manufacturing a semiconductor device by employing a dual damascene process according to another preferred embodiment of the invention.

Referring to FIG. 3A, there are successively formed a first etch stop film 215, a second insulation film 220, a second etch stop film 225, a third insulation film 230, and a capping film 235 on a first insulation film 205 positioned on a semiconductor substrate 200. A conductive pattern 210 is buried in the first insulation film 205 (i.e. the conductive pattern 210 is formed in a trench of the first insulation film 205).

After a first photoresist film (not shown) is coated on the capping film 235, the first photoresist film is patterned to form a first photoresist pattern 240 for forming the trench 245.

Continuously, the capping film 235, the third insulation film 230, and the third etch stop film 225 are partially etched using the first photoresist pattern 240 as an etching mask so that the trench 245 for forming the metal wiring is formed through the third insulation film 230.

Figure 3B:
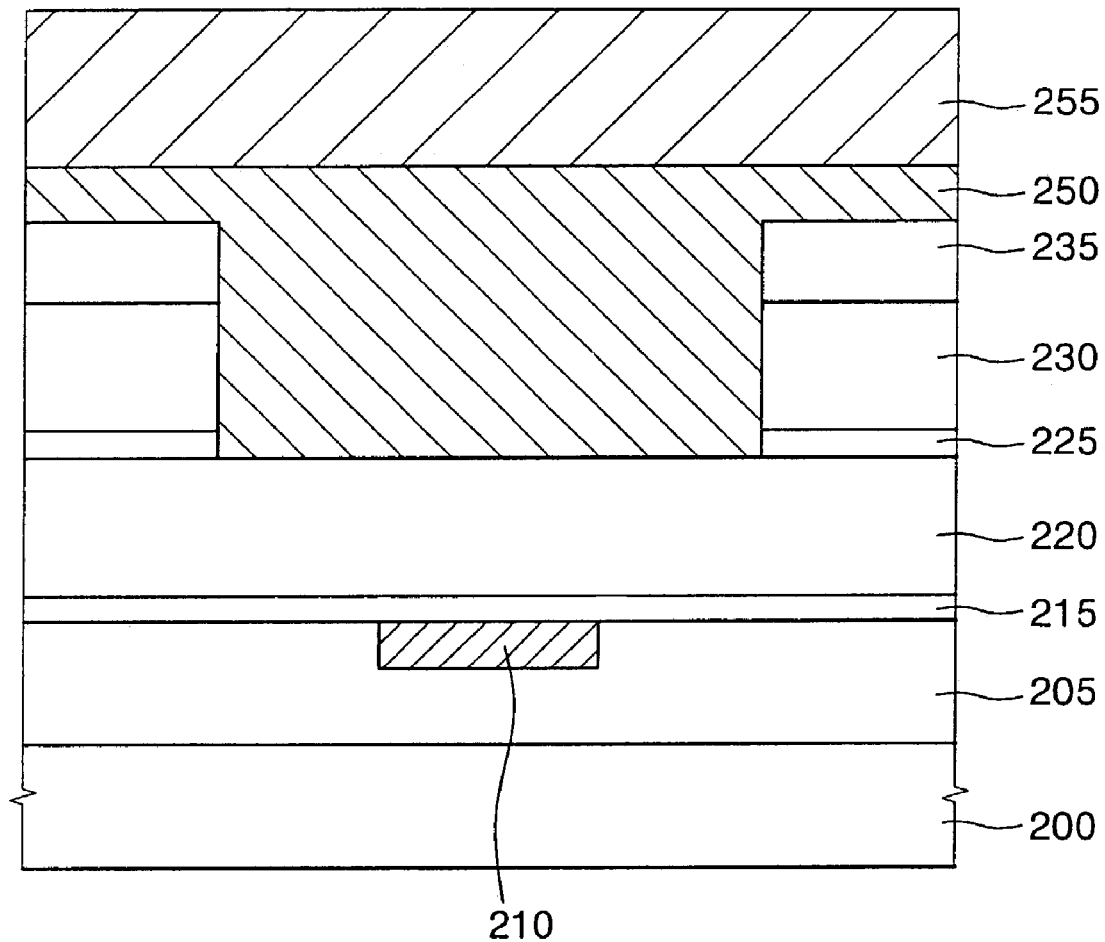

Referring to FIG. 3B, after a filling film 250 including a water-soluble polymer is formed on the capping film 235 to fill up the trench 245, a second photoresist film 255 is formed on the filling film 250. The filling film 250 includes at least one water-soluble polymer selected from the group consisting of polyvinylalcohol, carboxymethylcellulose, polyacrylic acid, polyacrylamide, polyvinylpyrrolidone, polyethyleneoxide, and water-soluble polyurethane. The DOF of the photolithography process for forming a second photoresist pattern 260 is improved, and the processing margin of the photolithography process is sufficiently ensured because the second photoresist film 255 has a thin thickness due to the filling film 250 including the water-soluble polymer.

Figure 3C:
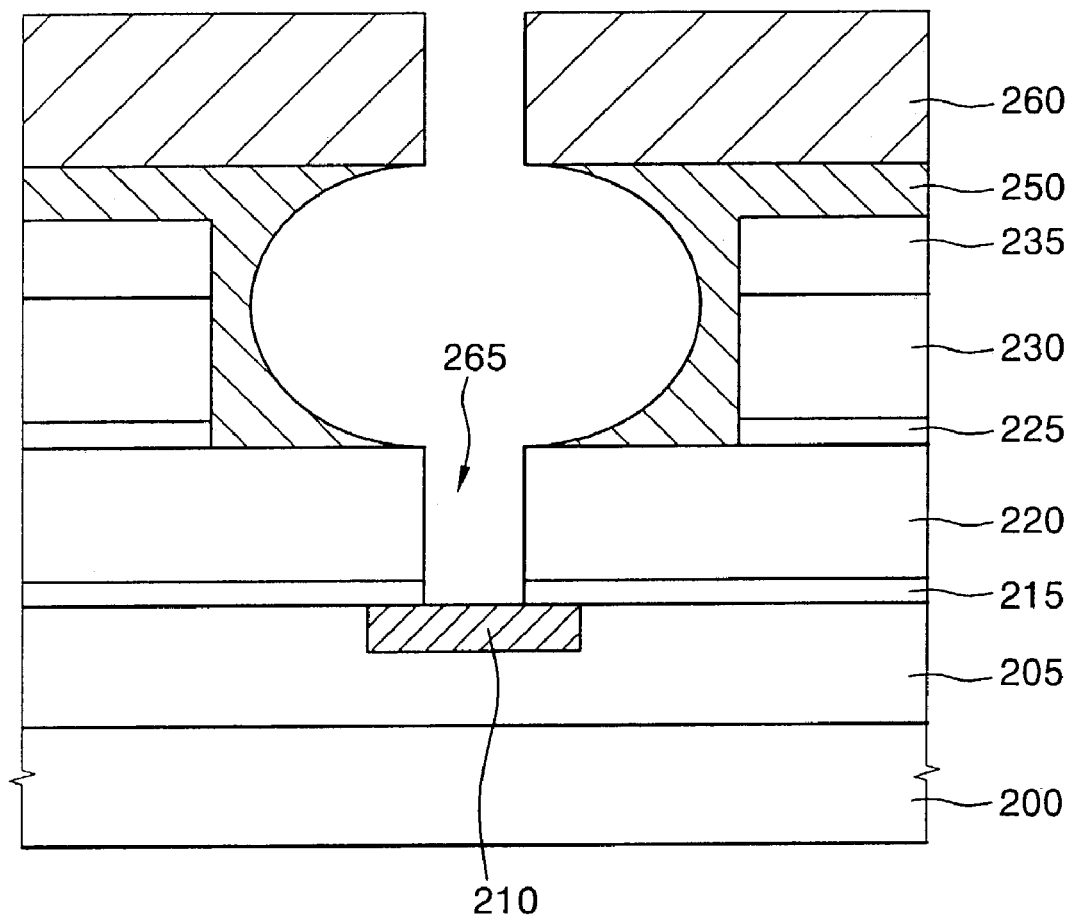

Referring to FIG. 3C, the second photoresist film 255 is exposed, developed, and rinsed such that the second photoresist pattern 260 for forming the via hole is formed. At that time, the majority of the filling film 250 under the second photoresist pattern 260 is removed when the second photoresist film 255 is exposed, developed, and rinsed with a solution including water like de-ionized water, SC-1, or SC-2.

Subsequently, the second insulation film 220 and the first etch stop film 215 are partially etched using the second photoresist pattern 260 as an etching mask so that a via hole 265 overlapped by the trench 245 is formed through the second insulation film 220. As a result, the upper face of the conductive pattern 210 is partially exposed.

Then, the second photoresist pattern 260 is removed through an ashing process and a stripping process. When the second photoresist pattern 260 is removed using a solution including water such as the de-ionized water, SC-1, or SC-2, the remaining filling film 250 beneath the second photoresist pattern 260 is completely removed.

Figure 3D:
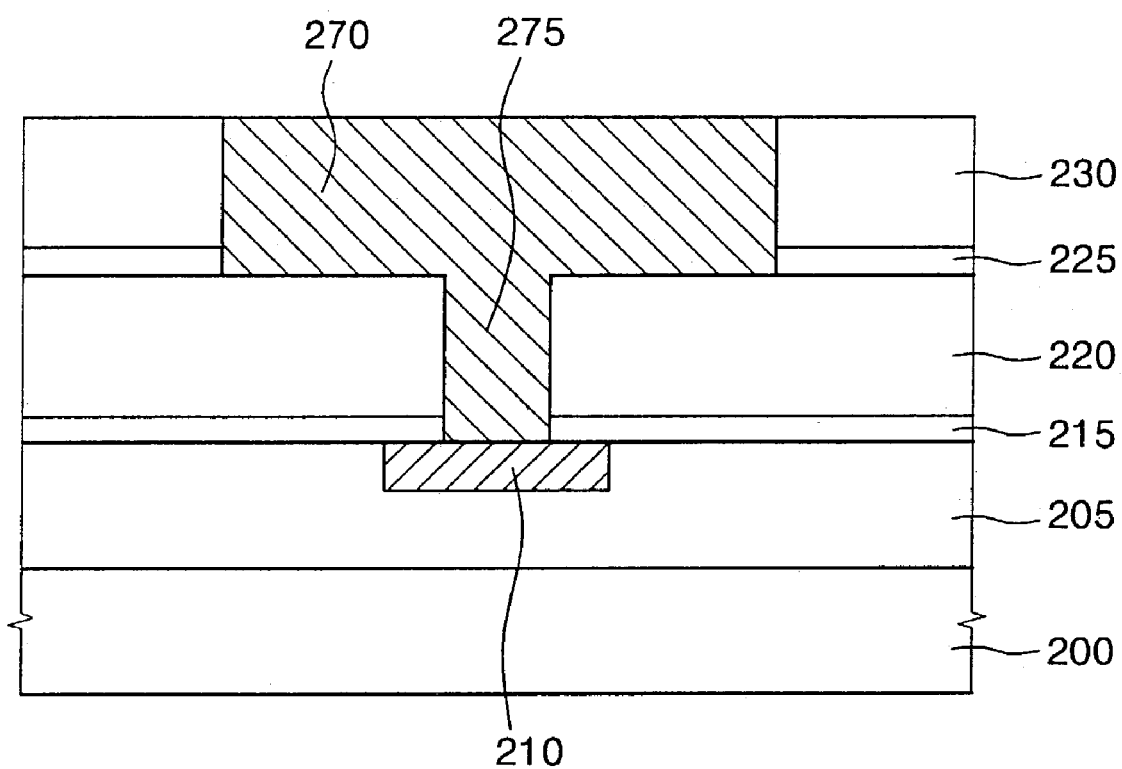

Referring to FIG. 3D, a metal film is formed on the capping film 235 to fill via hole 265 and the trench 245 by using metal such as copper through a sputtering process, a chemical vapor deposition process, or an electro plating process. Continuously, the metal film is polished by a CMP process so that the metal wiring 270 and the contact 275 electrically connected to the conductive pattern 210 are formed in the trench 245 and the via hole 265, respectively.

As it is described above, because the filling film including the water-soluble polymer is employed during the processes for forming the trench and the via hole, the thickness of the photoresist film used in the photolithography process can be greatly reduced. Thus, the DOF of the photolithography process is improved and the processing margin of the photolithography process is sufficiently ensured. Additionally, the filling film can be employed for the process for simultaneously forming the via hole and the trench in order to enhance the DOF and the processing margin of the photolithography process.

According to the invention, after the filling film including the water-soluble polymer is primarily filled in the via hole or in the trench during the method for manufacturing the semiconductor device by employing the dual damascene process, the photoresist film is coated on the filling film. Then, the photoresist film is patterned to form the photoresist pattern for forming the via hole or the trench. Therefore, the DOF of the photolithography process is improved, and the processing margin of the photolithography process is effectively ensured because the photoresist film has a greatly reduced thickness in comparison with the conventional photoresist film employed for the dual damascene process.

Also, the yield of the process for manufacturing the semiconductor device is enhanced since the dimensions of the via hole and the trench are precisely controlled in accordance with the accurately controlled photoresist pattern.

Having described the preferred embodiments for manufacturing the semiconductor device, it is noted that modifications and variations can be made by persons skilled in the art in light of the above teachings. It is therefore to be understood that changes may be made to these particular disclosed embodiments that are nonetheless within the scope and the spirit of the invention outlined by the appended claims.

The invention claimed is:

1. A method for manufacturing a semiconductor device comprising:
    forming a first insulation film on a semiconductor substrate, the insulation film including a conductive pattern;
    forming at least one etch stop film on the first insulation film;
    forming at least one insulation film on the at least one etch stop film;
    forming a via hole through the at least one insulation film;
    filling the via hole with a filling film formed on the at least one insulation film;
    forming a photoresist film on the filling film; and
    patterning the photoresist film to form a photoresist pattern;
    wherein patterning the photoresist film comprises developing and rinsing the photoresist film, wherein the filling film is removed from the via hole during the developing and rinsing.

2. The method of claim 1, wherein filling the via hole with a filling film comprises filling the via hole with a water-soluble polymer.

3. The method of claim 2, wherein the water-soluble polymer comprises one selected from the group consisting of polyvinylalcohol, carboxymethylcellulose, polyacrylic acid, polyacrylamide, polyvinylpyrrolidone, polyethyleneoxide, and water-soluble polyurethane.

4. The method of claim 1, wherein forming the at least one insulation film on the at least one etch stop film comprises:
    forming a second insulation film on a first etch stop film; and
    forming a third insulation film on the second insulation film.

5. The method of claim 4, wherein filling the via hole with the filling film formed on the at least one insulation film comprises filling the via hole with the filling film formed on the third insulation film.

6. The method of claim 4, further comprising forming a trench through the third insulation film.

7. The method of claim 6, wherein forming the via hole comprises partially etching the third insulation film, the second insulation film, and the etch stop film, and wherein forming the trench comprises partially etching the third insulation film.

8. The method of claim 6, wherein forming the via hole comprises partially etching the second insulation film and the etch stop film, and wherein filling the via hole with the filling film further comprises covering the third insulation layer with the filling film to fill the trench.

9. The method of claim 1, wherein filling the via hole comprises forming the filling film so that a top surface of a first portion of the filling film that covers the via hale is substantially coplanar with a top surface of a second portion of the filling film that covers the at least one insulating layer.

10. A dual damascene method of manufacturing a semiconductor device, the method comprising:
    forming a first insulation film including a conductive pattern on a semiconductor substrate;
    successively forming a first etch stop film, a second insulation film, a second etch stop film, a third insulation film, and a capping film on the first insulation film;
    forming a first photoresist pattern on the capping film by patterning a first photoresist film formed on the capping film;
    partially etching the capping film, the third insulation film, the second etch stop film, and the second insulation film using the first photoresist pattern as an etching mask to form a via hole that exposes the first etch stop film;
    forming a filling film on the third insulation film to fill up the via hole;
    forming a second photoresist film on the filling film;
    patterning the second photoresist film to form a second photoresist pattern and to remove the filling film from the via hole;
    etching the capping film, the third insulation film, and the second etch stop film using the second photoresist pattern as an etching mask to form a trench that overlaps the via hole; and forming a metal wiring in the trench and a contact connected to the conductive pattern in the via hole.

11. The method of claim 10, wherein the filling film includes a water-soluble polymer.

12. The method of claim 10, wherein the filling film is removed during developing and rinsing of the second photoresist film.

13. A method for manufacturing a semiconductor device by employing a dual damascene process, comprising:

forming a first insulation film including a conductive pattern on a semiconductor substrate;

successively forming a first etch stop film, a second insulation film, a second etch stop film, a third insulation film, and a capping film on the first insulation film;

forming a first photoresist pattern on the capping film by patterning a first photoresist film formed on the capping film;

forming a trench by partially etching the capping film, the third insulation film, and the second etch stop film using the first photoresist pattern as an etching mask;

forming a filling film on the third insulation film to fill up the trench;

forming a second photoresist film on the filling film;

patterning the second photoresist film to form a second photoresist pattern and to remove the filling film;

etching the second insulation film and the first etch stop film using the second photoresist pattern as an etching mask to form a via hole that exposes the conductive pattern and is overlapped by the trench; and forming a metal wiring in the trench, and a contact connected to the conductive pattern in the via hole.

14. The method of claim 13, wherein the filling film includes a water-soluble polymer.

15. The method of claim 13, wherein patterning the second photoresist film comprises:

developing the second photoresist film; and rinsing the second photoresist film, wherein the filling film is removed during the developing and rinsing.

* * * * *